(12) United States Patent
Spotti

(10) Patent No.: US 9,716,467 B2
(45) Date of Patent: Jul. 25, 2017

(54) COMPACT APPARATUS FOR THE SEMI-AUTOMATIC HORIZONTAL ASSEMBLY OF PHOTOVOLTAIC PANELS

(71) Applicant: VISMUNDA SRL, Mestre (VE) (IT)

(72) Inventor: Davide Spotti, Trieste (IT)

(73) Assignee: VISMUNDA SRL, Mestre (VE) (IT)

( * ) Notice: Subject to any disclaimer, the term of this patent is extended or adjusted under 35 U.S.C. 154(b) by 103 days.

(21) Appl. No.: 14/744,686

(22) Filed: Jun. 19, 2015

(65) Prior Publication Data
US 2015/0372642 A1 Dec. 24, 2015

(30) Foreign Application Priority Data
Jun. 20, 2014 (IT) .............................. TV20140024 U

(51) Int. Cl.
*H02S 99/00* (2014.01)
*H01L 31/18* (2006.01)
(Continued)

(52) U.S. Cl.
CPC ............ *H02S 99/00* (2013.01); *H01L 31/188* (2013.01); *H02K 3/28* (2013.01); *H02K 11/0094* (2013.01); *H02K 11/046* (2013.01); *H02K 7/1815* (2013.01); *H02K 21/22* (2013.01); *H02K 2213/09* (2013.01); *H02K 2213/12* (2013.01); *Y02E 10/50* (2013.01); *Y02P 80/25* (2015.11); *Y10T 29/53135* (2015.01)

(58) Field of Classification Search
CPC H01L 31/188; H02K 11/0094; H02K 11/046; H02K 21/22; H02K 2213/09; H02K 2213/12; H02K 3/28; H02K 7/1815; H02S 99/00; Y02E 10/50; Y02P 80/25; Y10T 29/53135
USPC .................................................. 156/360, 378
See application file for complete search history.

(56) References Cited

U.S. PATENT DOCUMENTS 6,327,774 B1 * 12/2001 Cheon ..................... B23P 19/04
29/2
8,485,774 B2 7/2013 Risch et al.
(Continued)

FOREIGN PATENT DOCUMENTS

| DE | 102008046327 A1 | 3/2010 |
|----|-----------------|--------|
| WO | 03098704 A1 | 11/2003 |
| WO | 2008145368 A2 | 12/2008 |

*Primary Examiner* — George Koch
(74) *Attorney, Agent, or Firm* — Egbert Law Offices, PLLC

(57) ABSTRACT

Compact apparatus for the semi-automatic horizontal assembly of photovoltaic panels with solar cells, made up of a multi-function workstation in the form of a pilot system integrating multiple working and conveying means which carry out the various operations concomitantly and in a coordinated way. On the sides of the working surface there is the loading zone of the cells, the loading zone of the conductive ribbons and a pair of longitudinal rails which are intended to guide two mobile gantries, which roto-translate above the working surface, from one loading zone to the other, being equipped for the purpose of assembly. In particular, the compact apparatus is versatile in use and allows to obtain already in the experimental laboratory phases the levels of accuracy and control of an industrial system, for the purpose of optimizing the product and the assembly technologies reducing wastes and faults.

7 Claims, 5 Drawing Sheets

(51) Int. Cl.
    *H02K 3/28*     (2006.01)
    *H02K 11/00*     (2016.01)
    *H02K 11/04*     (2016.01)
    *H02K 21/22*     (2006.01)
    *H02K 7/18*     (2006.01)

(56) References Cited

U.S. PATENT DOCUMENTS

| | | | | |
|---|---|---|---|---|
| 2010/0058582 A1* | 3/2010 | Hofmann | ......... | H01L 31/02008 |
| | | | | 29/825 |
| 2013/0095578 A1* | 4/2013 | Baccini | ......... | H01L 31/18 |
| | | | | 438/14 |
| 2013/0105062 A1* | 5/2013 | Cena | ......... | H01L 31/048 |
| | | | | 156/64 |
| 2015/0236641 A1* | 8/2015 | Schmid | ......... | H02S 50/10 |
| | | | | 324/761.01 |

* cited by examiner

COMPACT APPARATUS FOR THE SEMI-AUTOMATIC HORIZONTAL ASSEMBLY OF PHOTOVOLTAIC PANELS

CROSS-REFERENCE TO RELATED U.S. APPLICATIONS

Not applicable.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

BACKGROUND OF THE INVENTION

1. Field of the Invention

The present invention relates to a compact apparatus for the semi-automatic horizontal assembly of photovoltaic panels with solar cells of silicon; said apparatus being of the multi-function system type for experimental or laboratory use, with a high level of precision of the working and great versatility of use.

2. Description of Related Art Including Information Disclosed Under 37 CFR 1.97 and 37 CFR 1.98.

The invention finds particular application in the industrial sector of photovoltaic panels with cells of crystalline silicon and is preferably, but not exclusively, intended for use in experimental research and development laboratories to easily carry out the assembly tests, the technological set-up, the tests and the qualifications of the new products with the same quality standards as a production system in its final and complete configuration. In more detail, the proposed apparatus is of the compact and multi-function type and substantially acts as a semi-automatic pilot system being structured as a single workstation equipped in such a way as to concomitantly carry out all the working processes provided for the assembly of a photovoltaic panel and repeat in an extremely small space the multiple operating phases which in an automatic production line are instead placed sequentially on separate workstations. Such a solution of a compact apparatus, therefore, is particularly versatile and is suitable for laboratory uses or for limited production volumes.

The proposed apparatus allows to assemble photovoltaic panels having cells of any type and size, also being suitable for panels of the evolved type called back-contact, which are also called of second generation to distinguish them from the conventional panels with front-contact and back-contact cells. Said back-contact panels are characterised by a multi-layer back support of the conductive type, which is conventionally called conductive backsheet, on which the innovative back-contact cells of silicon are mounted, which are generally placed in a matrix, by rows, to form panels for example having 48, 60 or 72 cells each. The invention allows to load such cells and contact them by means of conductive adhesives, of the type called ECA, said loading and said contacting being coordinated with each other and carried out concomitantly on the same working surface, in a precise and repeatable way, with the aid of optoelectronic control systems. On the same working surface one can also apply the layer of encapsulating material and the front glass.

Nowadays, in particular, one can consider as widely known the advantages provided by said photovoltaic panels with cells of the back-contact type; however, said panels are not very widespread yet due to realization difficulties which are mainly linked to the low availability of systems and of processes suitable for the current production standards, in particular with reference to the required precision in the loading and contacting of the cells, to product quality, to the automation of the systems and to industrial costs. Therefore, today the difficulties that can be found in the experimental phases of research and development aimed to the set-up of the product and of the technologies to be used in the automatic system that will produce it are even greater.

For the purpose of determining the prior art related to the proposed solution a conventional check was made, searching public archives, which has led to find some prior art documents, among which:

D1: US8485774 (Knoll et al.)
D2: WO2008145368 (Reinisch et al.)
D3: DE102008046327 (Kalmbach et al.)
D4: WO03098704 (Dings et al.)

D1 describes a high productivity system including a plurality of stringers which are arranged perpendicular to a transportation system that transfers them towards the central control and codification station before entering the adjacent interconnection station, where the complete matrix is formed, the system being controlled by a camera detection unit and managed by the central control system.

D2 describes an assembly station structured with two parallel working levels: an upper level for the cells and a lower level for the transparent glass, the preparation of the cells being separated into two adjacent tracks, which join each other to couple with the underlying glass in a laser welding station, the conveying devices being comprised in the overall dimensions of the aligned devices that form the production line.

D3 proposes a compact and versatile system for the assembly of photovoltaic panels having standard cells in a central station, grouping around it several devices having different functions: a support preparation device, two opposed devices for the pre-assembly of the cells, a device for the positioning of the transverse contacts on the substrate, a device for loading the pre-assembled cells, a device for the contacting between the cells, a device for closing the circuits of the strings and a device for fixing the components to the supporting glass.

D4 proposes a compact and versatile system for the production of photovoltaic panels having standard cells which is made up of four stations placed side by side in a crossed way where a first station is intended for the preparation of the cells, with an automated application of the conductive connecting elements both on the front and on the back of each cell, a second station is intended for the pre-assembly of the front glass with an upper layer of EVA, a third central station is for the stringing to form the matrix of cells directly on said glass translated to the centre, carrying out the contacting of the cells by welding or laser without contact, and a fourth final station where the protection layer is superimposed and the back electrical contacts of the panel are applied, and the panel is then rolled.

In conclusion it is reasonable to consider as known:

a continuous system for constructing panels with cells of the standard type and stringing carried out separately by means of welding, laser or induction;

a continuous system for constructing panels with cells of the back-contact type and contacting carried out directly on the conductive backsheet by means of a conductive adhesive in drops;

a system for panels having standard cells wherein, around the central assembly station, several devices having different functions are grouped;

a system for standard cells panels made up of four stations placed side by side in a crossed way, being respectively intended for the automated application of the conductive elements, for the pre-assembly of the glass with the EVA layer, for the complete stringing of the panel, for the superimposition of the back protection layer with the electrical contacts to form the panel ready for rolling.

Drawbacks

In conclusion, we have observed that all the known solutions have drawbacks or anyway some limits.

In the first place, it has been observed that the difficulties typically noticeable in the experimental phases of research and development aimed to the set-up of the product and of the related technologies mainly derive from the need to test separately in laboratory the various working processes with which the photovoltaic panel will be industrially assembled, using the same technology, the same mechanisms, the same level of precision and repeatability. In particular, such difficulties are widely known to the companies that develop and produce panels of the back-contact type because the loading and the electrical contacting of said back-contact cells on the conductive backsheet require a high level of precision in the execution and are the cause of frequent faults in production, for example due to the misalignment of the points of contacting between the cells and the conductive layer of the backsheet or due to problems of welding or distribution and centring of the ECA conductive adhesive.

In more detail as to the above-mentioned difficulties, it has also been observed that the known and conventional solutions of industrial systems for the assembly of photovoltaic panels, such as D1 and D2, are not suitable for experimental activities of research and development, for example in the context of a laboratory, as they are designed to continuously carry out the specific working processes required by the panel being produced and they are also expensive and bulky; therefore, it has been observed that all the known and conventional solutions are little versatile in use when changes to the product or to the related production technologies are required. Furthermore, we have observed that the solutions which are more compact in size, such as D3 and D4, are expensive, bulky, little versatile and do not allow to assemble the new panels with back-contact cells. In particular, it is pointed out that nowadays versatile, compact, reliable apparatuses of high comfort of use are not available on the market for the purpose of carrying out concomitantly and in an integrated way the various working processes which can be performed while assembling a photovoltaic panel, repeating in a laboratory the same conditions and the same levels of precision and repeatability which are typical of a continuous system designed for high production volumes. However, said experimental apparatuses with high reliability and versatility of use are currently necessary in the phases of development of the products of the evolved type, such as in the case of said panels with back-contact cells, the phase of optimization and set-up of the production technologies and of the assembly method being particularly complex and expensive.

Secondly, it has been observed that the equipment conventionally pre-arranged to carry out in a laboratory the various assembly phases, for example the loading with automatic alignment of the cells or the drop-by-drop application of the adhesive ECA by means of the dispensing technology are constructively separate and diversified from each other and therefore require high investment costs, considerably increasing such costs every time new equipment is tested.

Thirdly, it has been observed that said separate and diversified equipment occupies large spaces, considerably increasing such spaces every time new equipment is adopted.

Fourthly, it has been observed that said separate and diversified equipment implies long times for the manual transfer of the panel for the purpose of carrying out a complete assembly cycle, considerably increasing such times every time a new operating phase is adopted in the cycle, but above all the risks of introducing faults due to the following rearrangements, modifications and movements.

Fifthly, it has been observed that by using separate and diversified equipment it is hard to detect and electronically integrate with each other the working processes carried out separately, for the purpose of simulating with discontinuous phases, on different equipment, an automatic assembly cycle of the continuous and integrated type.

Sixthly, it has been observed that the use in experimental phases of multiple separate and diversified equipment increases the risk of injury for the operators because they are not integrated with each other and also, sometimes, are little protected if self-constructed.

Moreover, it has been observed that the various devices and equipment used in the experimental phases of research and development are not standardized but constructed according to a specific project of the customer for the purpose of carrying out some working processes or operating phases which are related to a particular panel, and also to adapt to the site where said research activities are performed, for example a laboratory; such solutions, therefore, do not allow to be industrially reused in the production site for the purpose of being correctly integrated in an automatic system of the continuous type which is intended to assemble the panel with high production volumes, it not being possible to recover the initial investment for said experimental equipment.

Hence the need for companies of the sector to find solutions which are more effective with respect to the currently existing solutions; the aim of the present invention is also to solve the described drawbacks.

BRIEF SUMMARY OF THE INVENTION

This and other aims are achieved by the present invention according to the characteristics as in the appended claims, solving the arising problems by means of a compact apparatus (10) for the semi-automatic horizontal assembly of photovoltaic panels (200) with solar cells (112), made up of a multi-function workstation in the form of a pilot system integrating multiple working and conveying means which perform the various operations concomitantly and in a coordinated way. On the sides of the working surface (100) there is the loading zone of the cells, the loading zone of the conductive ribbons and a pair of longitudinal rails intended to guide two mobile gantries (120, 130), which roto-translate above the working surface, from one loading zone to another, being equipped for the purpose of assembly. In particular, said compact apparatus (10) is versatile in use and allows to obtain already in the laboratory experimental phases the levels of precision and control of an industrial system, in order to maximize the product and the assembly technologies reducing wastes and faults.

Aims

In this way by the considerable creative contribution the effect of which has allowed to reach a considerable technical progress, some aims and advantages are achieved solving the main drawbacks mentioned above.

A first aim of the invention was to make a compact apparatus for the semi-automatic horizontal assembly of photovoltaic panels with cells of silicon, being particularly of the experimental laboratory type with great versatility of use, integrated, intended to easily apply different technologies and concomitantly carry out the multiple working processes which in an industrial system of the continuous type are carried out separately, such as the loading with automatic alignment of solar cells and other components, the drop-by-drop application of the adhesive ECA or the pre-fixing of the components with localised heating. In particular one wants to experimentally obtain, already in the initial phase of research and development, the levels of precision, control and repeatability of a modern industrial system of the continuous and automated type, for the purpose of planning each working process of the cycle and optimize the product and the assembly technologies, considerably reducing the changes and faults in production. The tolerances in the different working processes that can be obtained with the proposed apparatus are equal to about +/−50 microns on 2 square meters of actual working area; such a level of precision advantageously corresponds to the best values that today can be obtained from each working process, individually, in an automated production line for assembling solar panels.

A second aim was to considerably reduce the investment costs related to the experimental phases and to improve the quality of the result, with particular reference to the precision, accuracy and repeatability of the product made.

A third aim was to considerably reduce the space occupied by the equipment for the experimentation and the set-up of the product and of the technologies.

A fourth aim was to considerably reduce the times which are typically necessary for the manual transfer of the panel among the various experimental devices for the purpose of completing the assembly.

A fifth aim was to integrate physically and electronically the various experimental devices onto the same apparatus, also with integrated systems for detecting and controlling the working processes and quality, providing data that can be easily processed for statistical and experimental purposes.

A sixth aim was to make a safe apparatus, which reduces the risk of accidents during the handling of the panel being worked.

Another aim, linked to said first aim, was to be able to assemble in an equally easy way photovoltaic panels of different types, for example with solar cells of the standard type, or of the type called multi-busbars, or of the type known by the acronym HIT or HJT, or of the type known by the acronym MWT or of the type known by the acronym IBC.

An additional aim was to standardize a compact apparatus in the form of a modular, semi-automatic and multi-function operating station, in such a way that it can be also be used in laboratory, for experimental, prototype uses, or for small production series, and which can also be advantageously reused on an industrial level, in the production site, being correctly integrated in an automatic system of the continuous type for large production volumes, with minimum changes (retrofit) and recovering the initial investment.

These and other advantages will appear from the following detailed description of some preferred embodiments, with the aid of the schematic drawings enclosed whose details of execution are not to be considered limitative but only illustrative.

DETAILED DESCRIPTION OF THE INVENTION

The compact apparatus (10) provided by the invention is substantially a pilot system with one single working station having limited sizes and closed by panels, of the type called all-in-one, which integrates several functions for the purpose of carrying out concomitantly on the same working surface (100) the main working processes necessary for completely assembling, with extreme reliability and comfort of use, a photovoltaic panel (200) having cells (112) of crystalline silicon, one panel at a time, being particularly useful and versatile in the experimental, development and qualification uses (FIGS. 1-7).

Said compact apparatus (10) is of the semi-automatic type, all the working processes that can be carried out in the apparatus and that are aimed to the assembly of the panel (200) on the working surface (100) being completely automatic and coordinated with each other, such as the taking-laying of the components and/or the measured dispensing of conductive adhesive and/or the prefixing of the components on the lower encapsulating material and/or the movements and/or the detection and the electronic control by means of vision systems; on the other hand, the accessory operations, preparatory to said internal working processes, carried out mainly outside said apparatus as occurs, for example, for the loading of the semi-finished components on the conveyor belts or even for the final unloading of the assembled panel.

Figure 1:
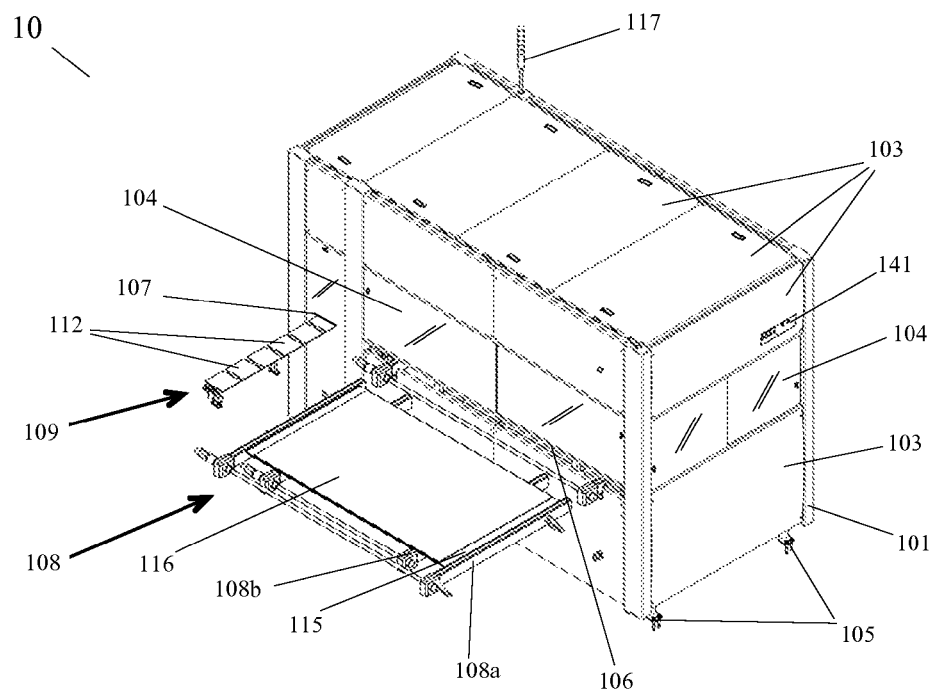
FIG. 1 shows, in an axonometric view, the compact apparatus according to the invention.
Figure 2:
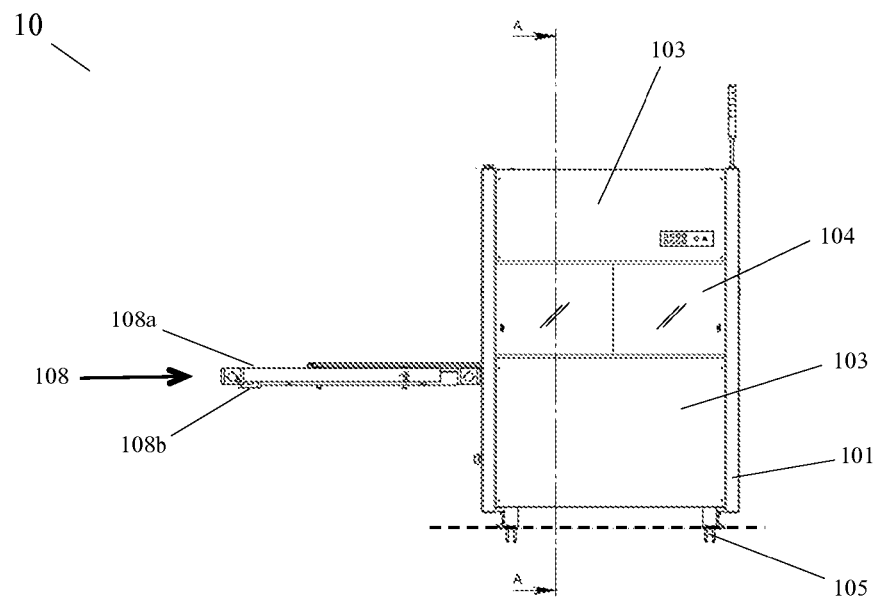
FIG. 2 shows, in a side orthogonal view, the compact apparatus according to the invention with the vertical section (A-A) as in the following FIG. 5.
Figure 3:
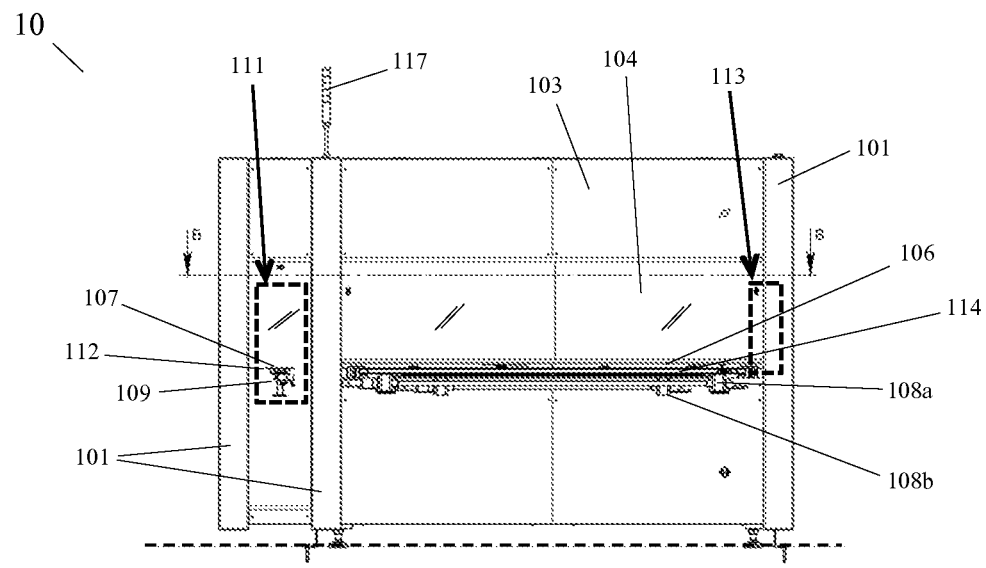
FIG. 3 shows, in an opposite orthogonal view, the compact apparatus according to the invention with the horizontal section (B-B) as in the following FIG. 6, and also with the internal zones of loading of the cells and of the ribbons.

To this purpose, said compact apparatus (10) concomitantly comprises multiple operating means managed in an integrated way by a logic control unit (140), for example of the PLC type used in industrial automation. Said logic unit is completely integrated for connections and functions into said compact apparatus, although physically placed inside or outside it, and is controlled by a control board (141) which can alternatively be inserted into the structure of the compact apparatus (10) or included in the logic unit (140) itself or even external, as a remote interface, being anyway connected to said logic unit in such a way as to easily enable the operator to programme and operate the invention for the purpose of carrying out a particular operation or sequence of operations coordinated with each other. Such operations, being selected and set according to the panel and/or to the specific execution modes required by the various research and development activities (FIGS. 1 and 6).

Said compact apparatus (10) is intended to carry out, individually or in a programmed and coordinated sequence, at least the following operations:
  translation of trays and semi-finished components from the outside to the inside of the apparatus (10), by means of at least one first conveyor belt (108) of the double-level and double-movement-direction (157) type—incoming-outgoing and one second conveyor belt (109) of the one-direction continuous loading (158) type;
  automatic movement with roto-translation (151-6) of ribbons and/or cells and/or plates inside the apparatus (10) in correspondence of the working surface (100), with a taking and laying logic of the type called pick and place, it being further possible to keep the front glass in a lifted position with respect to said working surface (100) for the purpose of the following superimposition;
  automatic dispensing of an electrically conductive adhesive of the ECA type, inside the apparatus (10) in correspondence of the working surface (100);
  automatic prefixing of the components, such as cells and ribbons, on the layer of encapsulating material by means of localised heating;
  detection and automatic control of the positioning and quality of the processes by means of camera vision systems, being integrated to enable the various operations;

Furthermore, said operations are individually programmed in each operating parameter by means of said logic control unit (100), according to the conventional methods of the PLC type, setting as a non-exhaustive example the duration and/or the temperature level and/or the characteristics of the machined products and/or the tolerances and any significant parameter of the operation.

Figure 4:
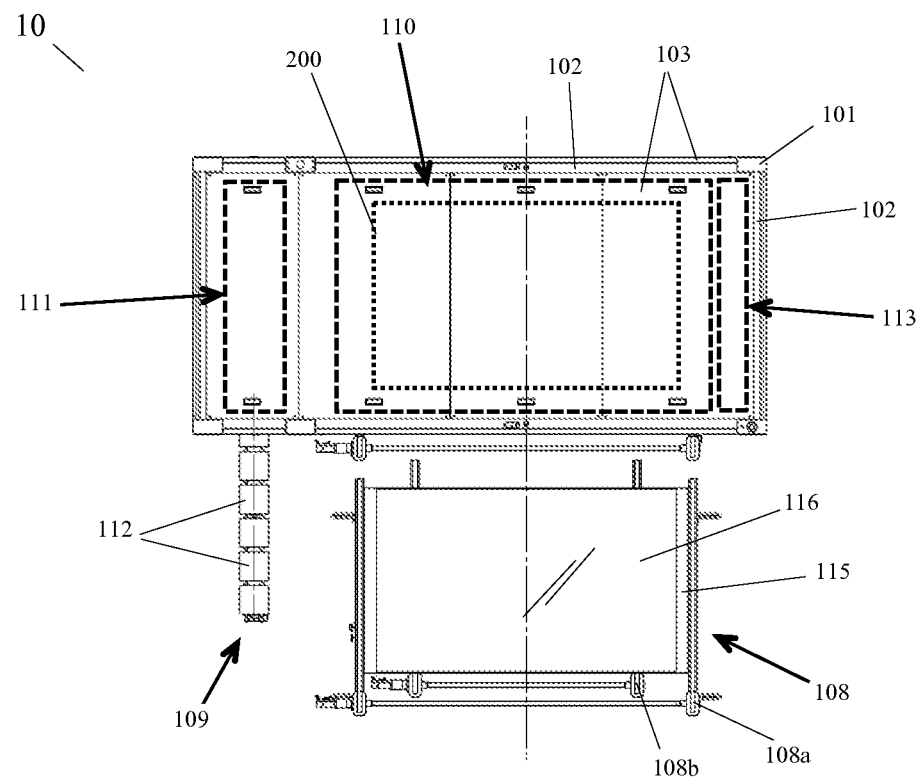
FIG. 4 shows, in an orthogonal view from the top, the compact apparatus according to the invention with the internal arrangement of the panel, on the working surface, and of the loading zones.
Figure 5:
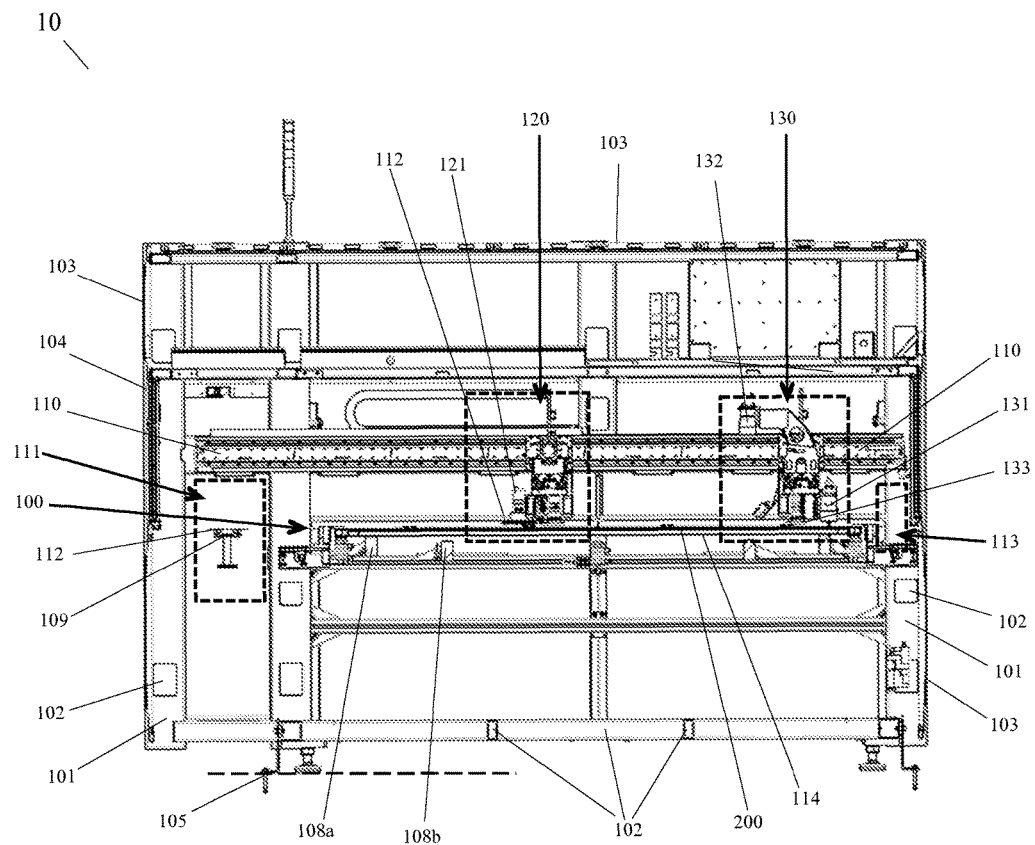
FIG. 5 shows, in a detailed view of vertical section (A-A) as in FIG. 2, the preferred embodiment of the invention highlighting the first and the second mobile gantries, which are parallel to each other being mounted on the same horizontal rail, and also highlighting the internal zones of loading of the cells and of the ribbons.
Figure 6:
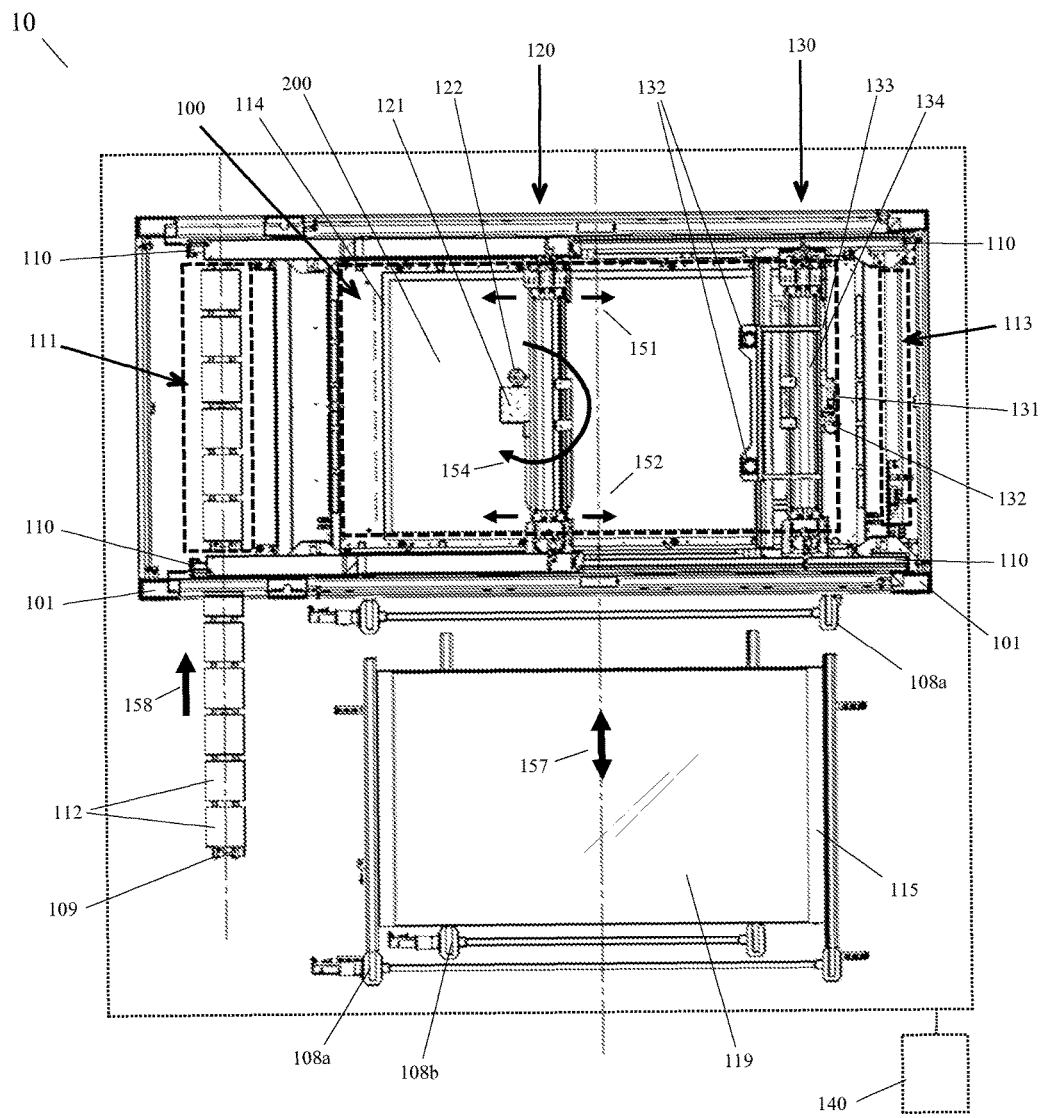
FIG. 6 shows, in a detailed view of horizontal section (B-B) as in FIG. 3, the preferred embodiment of the invention highlighting the movements of the mobile gantries and of the conveyor belts, the internal working surface and the internal loading zones.
Figure 7:
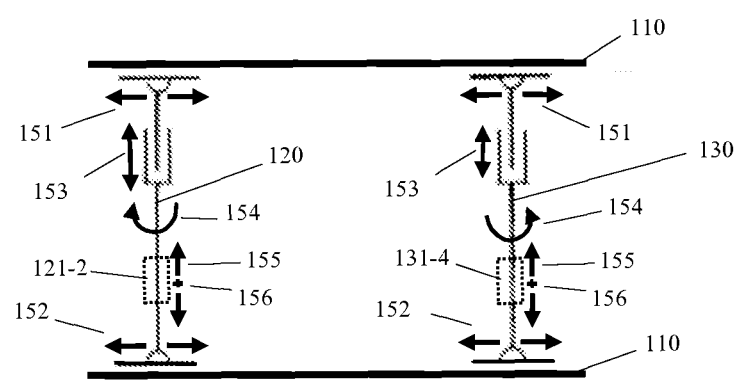
FIG. 7 shows, in a schematic view, the kinematic system of the mobile gantries equipped for the working processes, as in FIG. 6.

In more detail as to the specific embodiment configuration, said compact apparatus (10) (FIG. 1) is made up of:
  a support and containment structure of the modular type, for example in the form of a right-angled parallelepiped, made up of vertical uprights (101) and horizontal cross members (102), closed by opaque cover panels (103) and transparent plates (104) removable for looking at and accessing the working surface (100), which is placed horizontally inside said structure (FIGS. 2-4); and wherein said working surface (100) is flanked by a pair of longitudinal rails (110), opposite each other, which are horizontally fixed to said uprights and cross members in correspondence of the long sides of the apparatus (10) to guide the coordinated movements of at least two mobile gantries (120, 130), parallel to each other and equipped according to the specific requirements of the assembly (FIGS. 5 and 6). Each of the two mobile gantries can simultaneously and independently translate and rotate around the vertical axis (151-4) each of them being constrained in an integral way to the side rails (110) with hinge-sliding blocks independent and coordinated with each other (151-2) and is of the telescopic type (153) in such a way as to enable the rotation around the vertical axis (154) (FIGS. 6, 7); moreover, to complete the kinematic system, said mobile gantries are individually equipped with mobile working means that translate (155) longitudinally, along the gantry, and operate on the working surface (100) at least vertically (156). Inside said structure (101-4) and in proximity to the working surface (100), at the head and at the bottom, that is to say, at the ends of said longitudinal rails, there are provided two opposite loading zones (111, 113) which enable the automatic picking by said mobile gantries (120, 130) (FIGS. 4-6): a first loading zone (111) for the cells (112) and, on the opposite side with respect to the working surface, a second loading zone (113) for the ribbons in such a way that on said working surface it is also possible to perform operations coordinated with each other. Such operations can therefore be concomitant, operating on the same working surface, and can be also simultaneous, performing different operations in the same moment by means of said mobile gantries (120, 130) and said longitudinal rails (110). Preferably, for the purpose of providing greater stability to said structure during movements, it is provided to anchor it to the floor by means of mechanical fastenings (105);
  side openings (106, 107) at least at the height of the working surface and the loading surface of the cells, in the form of horizontal slits, to allow the crossing respectively of the trays (114-5) on the first conveyor belt (108*a-b*) and of the cells (112) on the second conveyor belt (109) (FIGS. 1 and 3);
  a first conveyor belt (108) or equivalent telescopic means for the horizontal translation of trays from the outside to the inside of the apparatus (10), of the double-body or double-level single system type, in such a way that the upper tray (114) is translated to an upper level (108*a*) in correspondence of said working surface (100), to assemble by superimpositions the components forming the panel (200), and the lower tray (115) is translated to a lower level (108*b*), to introduce into the structure the front glass (116), the two trays being superimposed in a parallel way, spaced from each other and coordinated in the incoming and outgoing;
  a second conveyor belt (109) for the horizontal translation of the cells (112) from the outside to the inside of the structure, in said first loading zone (111);
  at least one light indicator (117) for signalling the status of activity of the apparatus (10) and also the safety systems required by the regulations;
  a first mobile gantry (120), of the Cartesian robot type for roto-translation movement and control (151-4) as described above, mounted on said longitudinal rails (110) on the side of the first loading zone (111) to cover at least said first zone and the working surface (100), sliding parallel to it on hinge-sliding blocks independent and coordinated with each other; said first gantry, being provided at least with the following specific equipment (121-2) of the mobile type (155-6): means for the taking-laying (121) of the cells (112) with a pneumatic technology of the type called pick and place which also allows to take, to keep lifted and then place the front glass (116), being further provided with means for the detection and automatic control of the positioning and quality of the processes, comprising a camera vision system (122) of the type called automated optical inspection or AOI and combined with said taking-laying means (121) (FIGS. 5-7);

a second mobile gantry (130), of the twin type with respect to said first gantry (120) but with different functions, being mounted in a parallel and adjacent way on the same pair of longitudinal rails (110), on the opposite side in correspondence of the second loading zone (113), to cover at least said second zone and the working surface (100) translating parallel to it (151); said second gantry being provided with at least the following specific equipment (131-4) of the mobile type (155-6): means for the automatic dispensing of a conductive adhesive of the type called electronic conductive adhesive or ECA, using the technology called dispensing, which provides a calibrated dispenser of the drop-by-drop type (131) coupled with a syringe containing the adhesive, combined with means for the detection and automatic control of the positioning and quality of the processes of said AOI type with camera vision system (132), and also comprising means for the taking-laying (133) of the ribbons from said second loading zone (113) using said pneumatic technology, and also comprising means for the prefixing (134) by localised heating, for example with electrical resistors or IR lamps facing from above downwards to rapidly heat the underlying encapsulating material and activating its adhesive feature (FIGS. 5-7);

two trays (114, 115) with reference points and retaining means, for example pneumatic, wherein the upper tray (114) is for the assembly of the panel by means of superimpositions, being translated to the upper level (108a) of said first conveyor belt (108) in correspondence of the working surface (100), and wherein the lower tray (115) is for the translation of the glass (116) to a lower level (108b) which is parallel with respect to said first tray (FIGS. 1 and 4);

a logic control unit (140), of the PLC type or an equivalent system, intended to manage in an integrated way the whole compact apparatus (10) coordinating all the means and the equipment, as described above, and also coordinating any means added for the purpose of carrying out a further operation according to what is required by the experiment (FIG. 6).

Such a compact apparatus (10), made as described above, can advantageously be intended for experimental laboratory applications for the development and the qualifications of photovoltaic panels having cells of any currently available type, for example of the standard type or even of the back-contact type, being completely integrated in the functions, accurate and reliable in the processes, extremely versatile in use and with limited sizes. In particular, it is pointed out that the typical sizes of such an apparatus are linked to the panel (200) to be assembled, to the related working surface (100) and to the related loading zones (111, 113); moreover, it is known that the currently most widespread photovoltaic panels have a configuration with 48, 60, or 72 cells. As a non-exhaustive example, therefore, a compact apparatus (10) as described above, for the purpose of advantageously assembling in a laboratory panels with 60 cells as is required by the most widespread configuration on the market, has a right-angled parallelepiped structure having a width of about 220 cm, a length of about 350 cm and a height of about 210 cm, to which said conveyor belts (108-9) are added, which protrude horizontally outwards on the same side, like protruding shelves. Several tests have demonstrated that such a compact apparatus (10) allows, on average, a production capacity of about 4 panels per hour in the case of panels having 60 cells each. It was also found out that, a time of about 15 minutes being necessary for rolling such a photovoltaic panel in a traditional rolling furnace, said compact apparatus is advantageously balanced in terms of cycle time for experimental and laboratory use.

By means of said compact apparatus (10) it is possible, during the experimentation phases, to test on a panel different configurations and/or different assembly operating sequences, superimposing and working the single components on a backsheet initially loaded on the upper tray (114), with the encapsulating material facing upwards, to progressively form horizontally a complete photovoltaic panel ready for the subsequent external rolling phase, in rolling furnaces of the common and conventional type. Furthermore, it has been observed that particular panel configurations can also be obtained by the compact apparatus (10) according to the present invention using a second glass instead of the backsheet, to obtain photovoltaic panels of the type called glass-glass, because the cells surrounded by the layers of encapsulating material are enclosed by two glasses on the front and back sides.

As a non-exhaustive example and to highlight the great versatility and comfort of use of the compact apparatus (10) provided by the invention, what follows is an advantageous operating sequence for the assembly of a panel of the evolved type, with cells of the type called MWT, to reproduce in a laboratory the same production cycle as an industrial continuous-line system:

a) horizontal loading of the conductive backsheet on the upper tray (114), with the conductive layer facing upwards and the holed encapsulating material already coupled, said loading being carried out manually by the operator;

b) translation of said tray inside to be placed in correspondence of the working surface (100), said operation being carried out automatically by the first conveyor belt (108a);

c) detection and control from above downwards of said backsheet on the tray, said operation being carried out automatically by said means as in the second mobile gantry (130);

d) drop-by-drop dispensing of ECA on the conductive layer of the backsheet in correspondence of the electrical contact points, said operation being carried out automatically by said means as in the second mobile gantry (130);

e) loading of the cells (112) on the second conveyor belt (109) which enters the loading zone (111) in correspondence of the working surface (100), said loading being carried out manually by the operator;

f) taking and laying of the cells (112) aligned one row at a time until the completion of the panel, with the contacting points exactly on the back of the cell in correspondence of said drops of ECA, said operation being carried out automatically by said means as in the first mobile gantry (120, 151-6) and by the second conveyor belt (109);

g) detection and control of the cells (112), for example of the position coordinates, of the alignment or relative rotation, of the relative distance between cells, said operations being carried out automatically by said means as in the first mobile gantry (120, 151-6);

h) prefixing of the components, said operation being carried out automatically by said means as in the second mobile gantry (130, 151-6);

i) outgoing of the upper tray with the cells mounted on the backsheet, said operation being carried out automatically by the first conveyor belt (108*a*);

j) loading of the front glass (116) on the lower tray (115) of the first conveyor belt (108*b*), said loading being carried out manually by the operator;

k) translation of the glass into the apparatus, said operation being carried out automatically by the first conveyor belt (108*b*);

l) lifting of the glass which is separated from the tray and also held horizontally at a level higher than the working surface, said operation being carried out automatically by said means as in the first mobile gantry (120, 151-6);

m) outgoing of the empty lower tray (115), said operation being carried out automatically by the first conveyor belt (108*b*);

n) application of the front encapsulating layer, for example EVA, on top of the backsheet with the cells already mounted which is stationary outside on the upper tray (114), said loading being carried out manually by the operator;

o) translation of the upper tray (114) inside to be placed under the glass, said operation being carried out automatically by the first conveyor belt (108*a*);

p) laying of the glass (116) onto said EVA layer, said operation being carried out automatically by said means as in the first mobile gantry (120, 151-6);

q) detection and control of compliances, said operations being carried out automatically by the AOI vision systems as in the first (120, 151-6) and/or second mobile gantry (130, 151-6);

r) outgoing of the upper tray with the panel (200) completely assembled and checked, said operation being carried out automatically by the first conveyor belt (108*a*);

s) unloading of the assembled panel, said operation being carried out manually by the operator.

Afterwards, the panel (200) so assembled and prefixed can be easily overturned by the operator, for example by means of an external oscillating processing area which encloses the panel holding it during the overturn, and then loaded into a conventional furnace for the final rolling.

From what has been explained above, moreover, it is inferred that said compact apparatus (10) can be advantageously adapted according to particular experiments, to new working processes or new panels, said first (120, 151-6) and second mobile gantry (130, 151-6) being easily equippable with further means intended to carry out horizontally in an automatic way working processes also different from the others described above, provided that the elements making up such means are of the standard type for industrial automation for the purpose of being mechanically and electronically integrated in a complete way, for example by means of standard interfaces, logic support units, sensors and/or systems of the opto-electronic type.

In practice it has been ascertained that the above-mentioned aims of the invention have been achieved by realizing a compact apparatus (10) which allows important advantages for the experimentation and optimization of photovoltaic panels, facilitating research and development activities with great reliability, versatility and comfort of use, thus being an important contribution to making available and advantageous the energy produced by renewable sources.

REFERENCE (10) compact apparatus for the semi-automatic horizontal assembly of photovoltaic panels with cells;
(100) working surface,
(101) vertical uprights,
(102) horizontal cross members,
(103) opaque cover panels,
(104) transparent plates,
(105) fastenings to the floor,
(106) side opening for trays
(107) side opening for cells
(108) double-level first conveyor belt (108*a-b*) for superimposed trays,
(109) second conveyor belt for cells,
(110) power-operated longitudinal rails for the mobile gantries,
(111) first loading zone for the cells,
(112) solar cells,
(113) second loading zone for the conductive ribbons,
(114) upper tray,
(115) lower tray,
(116) front glass,
(117) status signalling light indicator,
(120) first mobile gantry of the three-axes Cartesian robot type,
(121) means for the taking-laying of the cells and of the glass,
(122) means for the detection and automatic control of the AOI type,
(130) second mobile gantry of the three-axes Cartesian robot type,
(131) means for the automatic drop-by-drop dispensing of adhesive of the ECA type,
(132) means for the detection and automatic control of the AOI type,
(133) means for the taking-laying of the conductive ribbons,
(134) means for prefixing by localised heating,
(140) programmable logic control unit of the PLC type which supervises the whole apparatus in an integrated way,
(141) control-board,
(151-4) movements of roto-translation of each gantry which is constrained to the side rails by means of hinge-sliding blocks independent and coordinated with each other
(151-2) in such a way as to enable the rotation around the vertical axis (154) being telescopic (153),
(155-6) movements of the mobile working means which translate (155) along each gantry and operate vertically (156),
(157) direction of movement of the superimposed trays,
(158) direction of movement of the cells,
(200) photovoltaic panel with cells

I claim:

1. An apparatus for horizontal assembly of photovoltaic panels so as to progressively assemble a supporting backsheet, conductive ribbons, photovoltaic cells, layers of encapsulating material, and a front glass, the apparatus comprising:
   a single multi-function workstation rolling workstation with a closed chamber, said rolling workstation having a working surface upon which the photovoltaic panel is assembled;
   a plurality of trays positioned on said working surface;

a plurality of conveyor belts protruding frontally from said closed chamber in correspondence to side openings positioned at a height of said working surface, one of said side openings being a horizontal slit through which the trays can cross on a first conveyor belt of said plurality of conveyor belts, another of said side openings allows a crossing of the photovoltaic cells on a second conveyor belt of said plurality of conveyor belts;

a first loading zone within said closed chamber on sides of said working surface, said first loading zone receiving the photovoltaic cells;

a second loading zone opposite to said first loading zone, said second loading zone receiving the conductive ribbons;

a pair of longitudinal rails adjacent to said working surface and to said first and second loading zones, one of said pair of longitudinal rails being opposite to the other of said pair of longitudinal rails, said pair of longitudinal rails longitudinally guiding coordinated and independent movement of at least two mobile gantries that slide horizontally above said working surface from one of said first and second loading zones to the other of said first and second loading zones, the mobile gantries each being a roto-translation Cartesian robot which simultaneously and independently translates and rotates about a vertical axis, each of the mobile gantries being telescopic and constrained to the longitudinal rail with a pair of hinge-sliding blocks coordinated with each other so as to control horizontal sliding and rotation about the vertical axis so as to facilitate alignment on said working surface, the mobile gantries having working elements that are mobile and which translate along the vertical axis, one of said at least two mobile gantries having a pneumatic mechanism that takes and lays the photovoltaic cells and the front glass and detects and automatically controls positions of the photovoltaic cells and the front glass, the other of said at least two mobile gantries automatically dispensing a conductive adhesive and a pneumatic component that takes and lays the conductive ribbons and which has localized heating; and a logic control unit cooperative with said at least two mobile gantries so as to coordinate the mobile gantries for the assembly of the photovoltaic panel on the working surface.

2. The apparatus of claim 1, further comprising:
a support and containment structure having vertical uprights, horizontal cross-members, opaque cover panels, and transparent plates, said transparent plates being removable so as to access said working surface.

3. The apparatus of claim 1, wherein said first conveyor belt is of a double-movement-level type configuration and which translates parallel in a coordinated and alternate way two of the trays so as to cross the side opening and which places itself inside said closed chamber in correspondence to the working surface, and wherein an upper level receives an upper tray on which the photovoltaic panel is assembled by progressive superimpositions, and wherein a lower level receives a lower tray which can introduce a component of the photovoltaic panel in correspondence to said working surface at a lower height so as to enable a lifting from a top by at least one of the mobile gantries when said upper tray is placed outside said closed chamber.

4. The apparatus of claim 3, wherein said upper and lower trays have reference points and retainers.

5. The apparatus of claim 1, wherein said one of said at least two gantries is mounted orthogonally on the longitudinal rails on a side of said first loading zone so as to cover at least said first loading zone and said working surface by roto-translating, one of said at least two gantries having a camera vision system.

6. The apparatus of claim 1, wherein the other of said at least two mobile gantries is a twin gantry, the other of said at least two mobile gantries automatically dispenses adhesive with a calibrated drop-by-drop dispenser that is coupled to a syringe containing the adhesive, the other of said at least two mobile gantries having a camera vision system and providing localized heating with electrical resistors or infrared lamps facing downwards to heat a portion of the photovoltaic cells.

7. The apparatus of claim 1, wherein the photovoltaic cells contain crystalline silicon.

\* \* \* \* \*